(12) United States Patent
Stautner

(10) Patent No.: US 7,631,507 B2
(45) Date of Patent: Dec. 15, 2009

(54) METHODS AND DEVICES FOR POLARIZED SAMPLES FOR USE IN MRI

(75) Inventor: Ernst Wolfgang Stautner, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 533 days.

(21) Appl. No.: 11/591,846

(22) Filed: Nov. 2, 2006

(65) Prior Publication Data

US 2008/0104966 A1    May 8, 2008

(51) Int. Cl.
- F25B 19/00    (2006.01)
- A61B 5/055    (2006.01)
- G01V 3/00     (2006.01)
- G01V 3/18     (2006.01)

(52) U.S. Cl. .................. 62/51.1; 424/9.3; 324/307; 324/318; 324/324

(58) Field of Classification Search .......... 62/6, 62/51.1; 424/9.3; 324/307, 318, 324
See application file for complete search history.

(56) References Cited

U.S. PATENT DOCUMENTS

| | | | | |
|---|---|---|---|---|
| 4,827,736 | A * | 5/1989 | Miura et al. ................. | 62/51.1 |
| 5,018,359 | A | 5/1991 | Horikawa et al. | |
| 5,513,498 | A * | 5/1996 | Ackermann et al. .......... | 62/51.1 |
| 5,970,720 | A * | 10/1999 | Katagiri et al. .................. | 62/6 |
| 6,293,111 | B1 * | 9/2001 | Nacher et al. ................. | 62/51.1 |
| 6,466,814 | B1 | 10/2002 | Ardenkjaer-Larsen et al. | |
| 7,102,354 | B2 | 9/2006 | Ardenkjaer-Larsen et al. | |
| 7,415,830 | B2 * | 8/2008 | Wyatt et al. ....................... | 62/6 |
| 2004/0049108 | A1 | 3/2004 | Ardenkjaer-Larsen et al. | |
| 2004/0066193 | A1 | 4/2004 | Ardenkjaer-Larsen et al. | |
| 2005/0225328 | A1 | 10/2005 | Ardenkjaer-Larsen et al. | |
| 2005/0262851 | A1 * | 12/2005 | Atrey ............................... | 62/6 |
| 2006/0130493 | A1 * | 6/2006 | Strobel ....................... | 62/51.1 |
| 2006/0192559 | A1 | 8/2006 | Ardenkjaer-Larsen et al. | |
| 2008/0290869 | A1 * | 11/2008 | Hutton et al. ............... | 324/318 |
| 2009/0016964 | A1 * | 1/2009 | Kalechofsky et al. ........ | 424/9.3 |

FOREIGN PATENT DOCUMENTS

| | | |
|---|---|---|
| WO | WO0023797 | 4/2000 |
| WO | WO0237132 | 5/2002 |

OTHER PUBLICATIONS

PCT Search Report-Nov. 6, 2008.
Tanaeva, Irina, "Low-temperature Cryocooling", retrieved May 26, 2008, pp. 1-90.
Jan H. Ardenkjaer-Larsen , "Increase in Signal-to-Noise Ratio of >10,000 Times in Liquid-State NMR" PNAS, Sep. 2, 2003, vol. 100, No. 18, pp. 10158-10163.
Tanaeva, A and A.T.A.M. de Waele, "The Superfluid Vortex Cooler", Journal of Applied Physics, 98, 2005, 034911-1 to 034911-8.

* cited by examiner

*Primary Examiner*—William C Doerrler
(74) *Attorney, Agent, or Firm*—Eileen W. Gallagher

(57) ABSTRACT

A method and an apparatus for producing hyperpolarized samples for use in magnetic resonance imaging (MRI) are provided. The apparatus comprises an ultra-compact cryogen-free cryostat structure for use in polarizing a sample of selected material, wherein the cryostat structure comprises a central bore being adapted to be evacuated to create a vacuum region, and a cooling device inserted in the central bore or optionally close to the central bore for maintaining a selected temperature of the sample.

14 Claims, 3 Drawing Sheets

METHODS AND DEVICES FOR POLARIZED SAMPLES FOR USE IN MRI

BACKGROUND

The invention relates generally to devices and methods for polarizing samples for use in magnetic resonance imaging (MRI).

The present invention relates to nuclear magnetic resonance (NMR) analysis, particularly to nuclear magnetic resonance imaging (MRI) and analytical high-resolution NMR spectroscopy. MRI is a diagnostic technique that has become particularly attractive to physicians as it is non-invasive and does not involve exposing the patient under study to potentially harmful radiation such as X-rays. Analytical high resolution NMR spectroscopy is routinely used in the determination of molecular structure.

MRI and NMR spectroscopy lack sensitivity due to the normally very low polarization of the nuclear spins of the samples used. A number of techniques exist to improve the polarization of nuclear spins in the solid phase. These techniques are known as hyperpolarization techniques and lead to an increase in sensitivity. In hyperpolarization techniques, a sample of an imaging agent, for example C13 Pyruvate or another similar polarized metabolic imaging agent, is introduced or injected into the subject being imaged. As used herein, the term "polarize" refers to the modification of the physical properties of a solid material for further use in MRI. Further, as used herein, the term "hyperpolarized" refers to polarized to a level over that found at room temperature and 1 T, which is further described in U.S. Pat. No. 6,466,814. However, in order to exploit the NMR signal for in vivo medical imaging the polarized sample must be brought into solution before being introduced into the imaging object. In addition, for in vitro analytical NMR spectroscopy, it can also often be advantageous to bring the polarized solid sample into solution. Techniques are now being developed which involve ex vivo polarization of imaging agents, prior to administration and MR signal measurement. In some instances, the imaging agent undergoes hyperpolarization remote from its end use, at the MRI scanner. A problem exists for ex vivo polarization in that the polarized solid sample has to be brought into solution and transferred into the NMR magnet with a minimal loss of polarization. U.S. Pat. No. 6,466,814 describes an apparatus and method for dissolving solid polarized samples. In this method the polarized sample was manually lifted out of the cryostat and within about 1 second dissolved in deuterium oxide at 40° C., while being subjected to a magnetic field of 0.4 T. This method enhanced the polarization by a factor of up to 21 compared to other methods of producing a solution containing polarized sample.

Further, in current contemplated techniques in order to produce an apparatus that can produce samples with a high polarization, the NMR equipment needs to be provided with a low temperature space that is in a magnetic field. In order to achieve this, any ordinary NMR magnet that has a suitably wide bore size may be equipped with a flow cryostat and instrumentation in order to enable the production of solutions of molecules with enhanced nuclear polarization. A flow cryostat is a vacuum insulated chamber that may be inserted into the bore of a magnet normally may be designed to have a room temperature bore, thereby allowing the temperature of the bore to be lowered by a stream of a cold cryogen. The flow cryostat is usually connected to an external cryogen supply through a transfer line and pumping device, and the flow of cryogen into the flow cryostat cools the bore of the magnet and forms a low temperature space. The flow cryostat may be equipped with means to enable the polarization of solid samples by various polarization techniques and it may be equipped with instrumentation for the detection of nuclear signals in the solid state and in solution. Typically, in dedicated systems for NMR analysis or production of hyperpolarized imaging agents, the low temperature space is preferably integrated into the magnet cryostat. Thus, current hyperpolarization systems and techniques require cooling means in the form of a cold cryogen in addition to the cryogens required for cooling the magnet in the MRI system. There are various practical and environmental challenges associated with cryogen storage and maintenance. Additionally, there are challenges in the clinical setting associated with handling of cryogens. Therefore there is a need to explore opportunities to reduce the cryogen usage in MRI systems and therefore there is a need for a reduced cryogen or cryogen-free hyperpolarization device and methods thereof.

BRIEF DESCRIPTION

In a first aspect of the invention, an apparatus for producing hyperpolarized samples for use in magnetic resonance imaging (MRI) is provided. The apparatus comprises a cryogen-free cryostat structure for use in polarizing a sample of selected material, wherein the cryostat structure comprises a central bore being adapted to be evacuated to create a vacuum region, and a cooling device inserted in the central bore for maintaining a selected temperature of the sample.

In a second aspect of the invention, a method for producing hyperpolarized samples for use in magnetic resonance imaging (MRI) is provided. The method comprises providing a cryostat structure for use in polarizing a solid sample of selected material, wherein the cryostat structure comprises a bore for containing the polarizing subsystem, the bore being configured to create a vacuum region, and, a cooling device inserted in the bore for maintaining a selected temperature in the sample.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
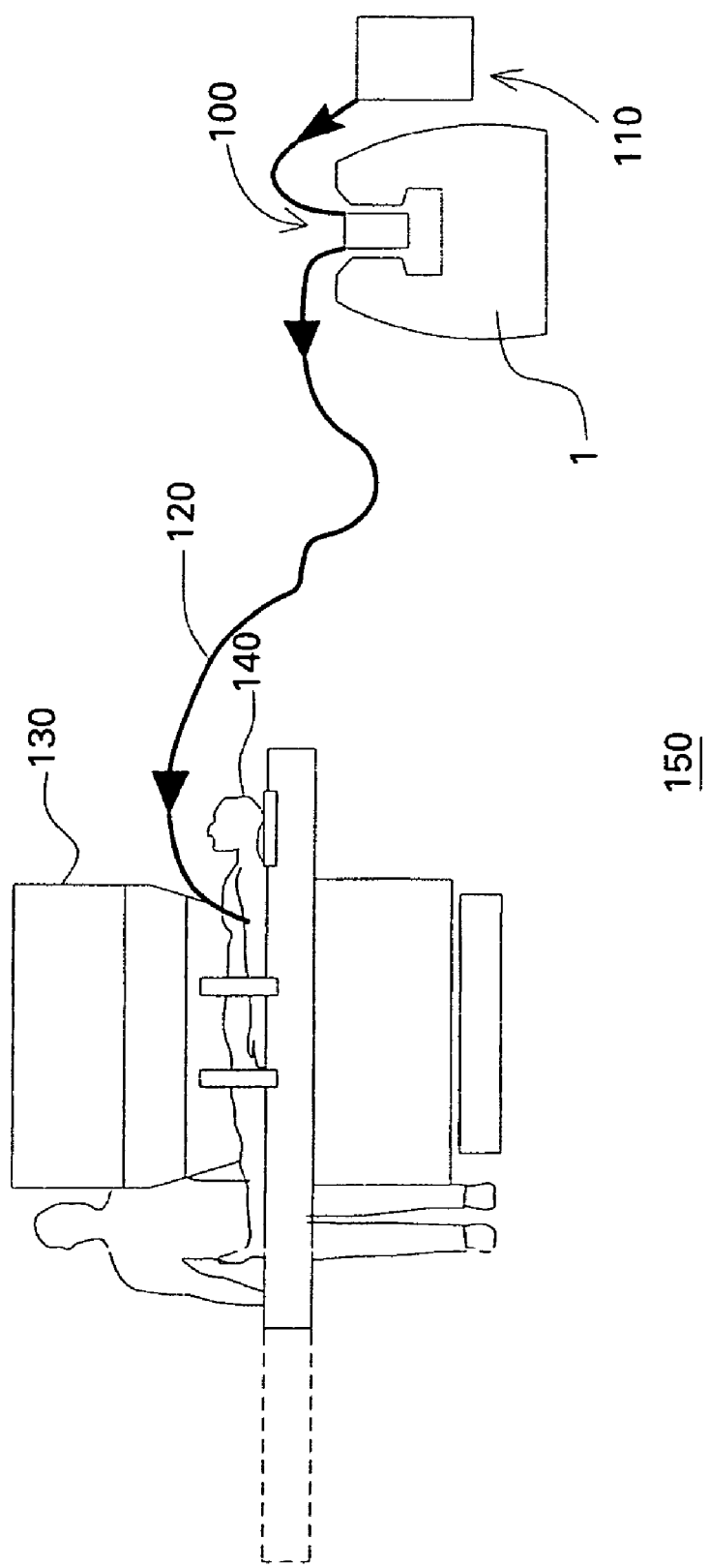
FIG. 1 is an illustration of an exemplary MRI system and polarizing subsystem to which embodiments of the present invention are applicable.

Referring to FIG. 1, a exemplary system 150 is shown for producing hyperpolarized samples for use in a MRI device and includes a cryostat 1 and polarizing subsystem 100 for processing material from container 110 and resulting in the hyperpolarized material. A material delivery line 120 is used to deliver the hyperpolarized material to subject 140 within MRI scanner 130. In the embodiment shown in FIG. 1, the hyperpolarized samples are used in an in vivo imaging application. It is to be appreciated that hyperpolarized samples may also be produced using the methods and techniques described below for Nuclear Magnetic Resonance (NMR) analysis.

In methods and devices in accordance with the present invention, a solid sample of the sample to be polarized can be polarized while still in the solid phase by any appropriate known method, e.g. brute force polarization, dynamic nuclear polarization or the spin refrigerator method, while being maintained at a low temperature (e.g. under 100 K) in a strong magnetic field (e.g. 1-25 T). After the solid sample has been polarized, it is melted with a minimum loss of polarization. In the following the expression "melting means" will be considered to mean the following: a device capable of providing sufficient energy to the solid polarized sample to melt it or otherwise bring the polarized sample into solution for introduction into the subject being imaged. As used herein, the term "solid" refers to solid materials, semi-solid materials or any combination thereof provided the material requires some transformation to attain a liquid state suitable for introduction into a subject being imaged.

For most solid samples, the relaxation rate (loss of polarization if hyperpolarized) increases rapidly as a function of inverse field strength. Therefore, for these polarized samples it is preferable that they are kept in a strong magnetic field (e.g. greater than 0.1 T) while being handled. Other reasons for the loss of polarization are also known, e.g. sudden changes of magnetic field orientation, strong magnetic gradients, or radio frequency fields, and these should be avoided as much as possible. The melting of the polarized sample can be promoted by several methods, e.g. ultra sound, microwave heating, laser irradiation, radiation or conduction or any other means that will deposit into the solid sample the energy required to melt it. The relaxation rate as a function of temperature and field is unique to every solid sample and solvent/solute system. It is therefore advantageous to optimize the temperature of the process for minimal relaxation of the actual sample being melted. In general, but not always, the magnetic field should be as strong as possible. The minimum $T_1$ during the process will generally increase with increasing magnetic field.

Figure 2:
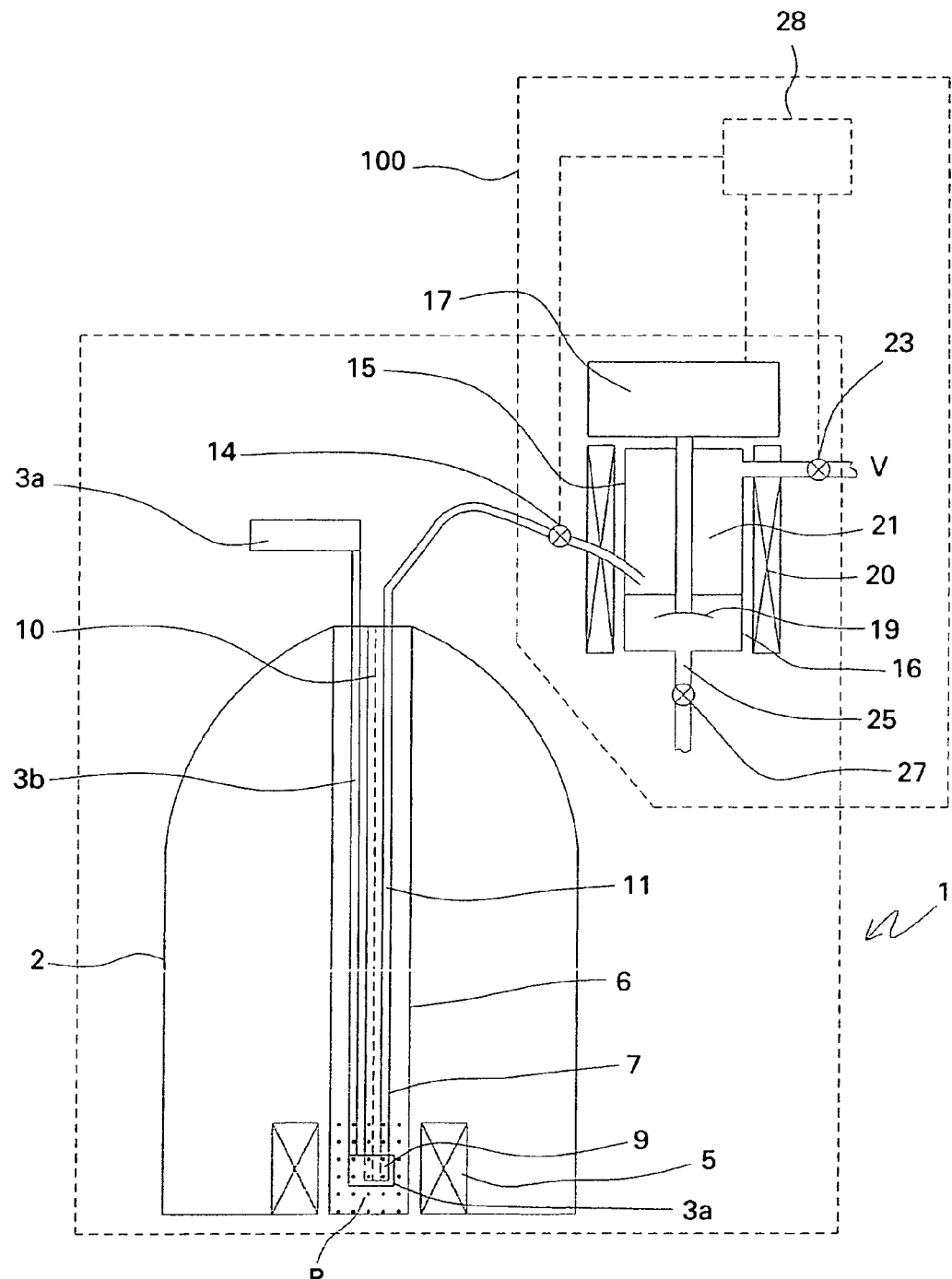
FIG. 2 is a lateral view of a schematic according to the current state of the art of a system for producing hyperpolarized samples for use in MRI.

An embodiment of a system according to the current state of the art is illustrated schematically in FIG. 2. FIG. 2 shows an example of a cryostat device 1 for polarizing a solid sample which device 1 is provided with solid polarized sample melting means as described above. Device 1 (shown enclosed by dashed lines) comprises a cryostat 2, containing a polarizing means 3, e.g. a microwave chamber 3a connected by a wave guide 3b to a microwave source 3c, in a central bore 6 surrounded by magnetic field producing means such as superconducting magnet 5. Cryostats and polarizing means for polarizing solid sample are well known and their constructions will not be described in detail. The bore 6 extends vertically down to at least the level of a region P near the superconducting magnet 5 where the magnetic field strength is sufficiently high, e.g. between 1-25 T or more, for example 3.5 T, for polarization of the sample to take place. The central bore 6 is sealable and can be evacuated to low pressures e.g. pressures of the order of 1 mbar or less. A sample-introducing means such as a removable sample-transporting tube 7 can be contained inside the bore 6 and this tube 7 can be inserted from the top of the bore down to a position inside the microwave chamber 3a in region P. Region P is cooled by liquid helium to a temperature low enough for polarization to take place, e.g. temperatures of the order of 0.1-10 K. Additionally, a pump (not shown) is needed to maintain a quantity or desired level of liquid helium in region P. Tube 7 can be sealed at its upper end in any suitable way in order to retain the partial vacuum in the bore 6. A sample-retaining container, such as a sample-retaining cup 9, can be, preferably removably, fitted over the lower end of sample-transporting tube 7. This cup 9 covers the bottom of tube 7 and is intended to hold any sample introduced into tube 7. Cup 9 is preferably made of a light-weight material with a low specific heat capacity such as a foamed plastic, e.g. polystyrene or of glass type, e.g. Pyrex or Polymethyl methacrylate (PMMA), so that the heat capacity of the cup 9 is as low as possible. A sealable He inlet tube 10 (shown by a dashed line for ease of illustration) extends from the top of bore 6 to the base of cup 9.

With further reference to FIG. 2, a sample in the sample-retaining cup 9 is polarized in the normal manner and then brought into a liquid phase by being melted. This melting of the polarized sample in the sample-retaining cup 9 is performed while the polarized sample is still inside the cryostat device 1. This can be achieved by providing a means for applying energy to the polarized solid sample, e.g. ultra sound, electromagnetic energy, or by bringing the solid polarized sample into contact with a warm surface or substance. In the device shown in FIG. 2 the solid polarized sample is melted in the sample-retaining cup 9 by a means for applying energy to the polarized solid sample in the form of a laser (not shown) mounted outside the cryostat which fires electromagnetic radiation though an optical fibre 4 onto the sample in the sample-retaining cup 9.

The device 1 further comprises extracting subsystem 100 (shown by dashed lines to include components to be described below) for extracting material from the sample-retaining cup 9. Extracting subsystem 100 for extracting material is coupled to an extraction tube 11 within bore 6 that extends from a short distance above the base of sample-retaining cup 9, via a valve 14 to a unit for dissolved polarized material 15. Valve 14 can manually, or preferably, under computer control, be opened to allow communication between extraction tube 11 and the unit for dissolved polarized material 15, and can be closed to prevent such communication. Unit for dissolved polarized material 15 has a hollow body 16 and can be provided with means to speed up the dissolving of solids such as mixing, stirring or agitating means 17 such as an electric knife mixer with blades 19. Preferably all surfaces that polarized material may come into contact with are coated to prevent polarized molecules coming into contact with paramagnetic irons. Unit for dissolved polarized material 15 is preferably surrounded by means for producing a storage magnetic field, such as a permanent magnet 20 or an electromagnet. The expression "storage magnetic field" is intended to mean that the field strength inside the unit for dissolved material 15 should be sufficient to maintain the material hyperpolarized for a period of at least a few seconds and preferably for some minutes. The unit for dissolved polarized material 15 can be at least partly filled with a solvent 21 suitable for dissolving of the material. A source of vacuum V is connectable to the unit for dissolved polarized material 15 via a valve 23 which is preferably computer-controlled by a computer 28. The base of unit for dissolved material contains an outlet 25 that is provided with a valve 27, preferably computer-controlled, for controlling the discharge of the contents of unit for dissolved polarized material 15. The use of computer-controlled, or otherwise automate valves, is preferred as this permits the timing of the opening and closing of the valves to be controlled in an accurate and reproducible manner. Naturally, an operator may be used to initiate a process, for example, by pressing a start button or issuing a start command to a computer.

In an embodiment of a method for polarizing samples, the polarizing method comprises for melting a solid sample that has been polarized while in the solid state has the following steps: The sample, preferably in the form of powder, grains or beads in order to facilitate rapid and even melting, but possibly in the form of a liquid at room temperature, is introduced into the sample-retaining cup 9 at bottom of the sample-transporting tube 7; sample-transporting tube 7 is introduced into bore 6 so that sample-retaining cup 9 is positioned in a magnetic field of the necessary field strength, bore 6 is made vacuum tight and evacuated to its working pressure; the still solid sample is polarized, preferably hyperpolarized; and bore 6 is pressurized to atmospheric pressure. Thereafter, the means for applying energy to the polarized solid sample is activated, energy is applied to the solid sample, e.g. by laser and optical fibre (not shown), and the solid sample melted. Optionally, a further step of analyzing the polarized liquid sample by NMR is performed, for example prior to end use in a comprehensive NMR analysis or in vivo imaging applications.

In further embodiments, a conceivable variation is the incorporation of a multiple sample holder into the device so that several samples can be polarized at once or sequentially and melted one by one. It is also conceivable to use a system where several samples are melted and analyzed simultaneously. As is obvious to the skilled person, a multiple sample holder system can be fashioned in many different ways e.g. using a carousel type holder or a grid-type holder.

In one embodiment it is possible to provide NMR equipment with a device in accordance with the present invention in order to produce an apparatus that can produce samples with a high polarization by dynamic nuclear polarization (DNP). In order to do this the NMR equipment needs to be provided with a low temperature space that is in a magnetic field. In order to achieve this, any ordinary NMR magnet that has a suitably wide bore size may be equipped with a flow cryostat and instrumentation as described below in order to enable the production of solutions of molecules with DNP enhanced nuclear polarization. A flow cryostat is a vacuum insulated chamber that may be inserted into the bore of a magnet normally designed to have a room temperature bore, thereby allowing the temperature of the bore to be lowered by a stream of a cold cryogen. The flow cryostat is usually connected to an external cryogen supply through a transfer line and the flow of cryogen into the flow cryostat cools the bore of the magnet and forms a low temperature space. The flow cryostat may be equipped with means, described below, to enable the polarization of solid samples by DNP and it may be equipped with instrumentation, described below, for the detection of nuclear signals in the solid state and in solution. Note that in dedicated DNP systems for NMR analysis or production of hyperpolarized imaging agents the low temperature space is preferably integrated into the magnet cryostat.

In a further embodiment, melting by laser can be chosen as an example of the method. A diode laser, or any other known laser or light-source, with an output power of 100 W is a common commercial product. This would take a water-based sample of 1 µl (ca. 1 mg) from 1 K to 300 K in 6.4 ms. In an example of this embodiment, a method for melting a solid sample that has been polarized while in the solid state has the following steps: The sample, preferably in the form of powder, grains or beads in order to facilitate rapid and even melting, but possibly in using a less powerful laser would increase the melting time proportionally. Diode lasers are available at a number of wavelengths at these power levels and the solid sample itself would preferably be able to absorb the light energy, or it could be doped with an absorbing molecule, or the interface to the solid sample could be coated with an absorbing material. Thus the wavelength can be chosen to match the absorption characteristics of the solid sample or the plate that it is supported on. A sample plate material with good absorption of the laser energy and low thermal conductivity is preferable for good melting efficiency. A current controlled mirror can control the laser beam or, alternatively, the sample may be moved and the laser kept stationary.

In yet another embodiment, melting the polarized solid sample is done by bringing it into thermal contact with a warm liquid. In accordance with this embodiment, the method comprises injecting or inserting the sample as a liquid (which would subsequently be frozen e.g. in the cryostat) or flowable solid e.g. powder, beads, etc. into a sample-receiving space in a capillary. Optionally, the sample receiving-space may be surrounded by a solenoid coil. The capillary can be introduced into the cryostat and the sample frozen and polarized as described above. After the polarization a volume of hot liquid may be injected into the sample receiving-space through the capillary tube and the solid sample rapidly melted. Alternatively the sample receiving space could be surrounded by, and in thermal contact with, a means for applying energy to the polarized solid sample in the form of a chamber or coil of tubing able to be filled with a hot liquid. In this way the polarized sample can be melted by heat energy transferred from the hot liquid into the sample-receiving space though the walls of the chamber or coil. In this way, dilution of the sample is avoided. Preferably the injected liquid will also serve as a susceptibility matching medium for the solenoid coil. The melted polarized sample can be analyzed in situ or alternatively flushed out of the capillary to a separate spectroscopy or imaging area.

While heating with a laser and hot liquid have been described, any method of applying energy may be used and indeed a combination of sources for applying thermal energy to the sample is possible. For example the laser melting could be assisted by an electrical heat element. It is important that the melting happens on a time scale of T1 (or preferably less) for the nuclear spin. The loss of polarization during the melting should be less than 99%, preferably less than 90% and even more preferably less than 10% and these different levels of loss of polarization can be reproducibly achieved by adapting the speed of melting of the polarized solid sample. It is also preferable that the supply of energy to the sample is regulated to maintain the sample liquid after melting so that imaging can be performed on the melted sample.

A sample holder and a suitable microwave structure may be placed in the cold space in order to achieve microwave irradiation of the sample. The microwave structure can be a horn antenna or a chamber attached to the end of a wave-guide (as shown in FIG. 2) or a set of Fabry-Perot mirrors or any other suitable microwave irradiating structures. The microwave structure is preferably designed to act as a resonance chamber for microwaves in order to increase the strength of the microwave field in the microwave structure. For the lower frequencies (less than ca. 200 GHz) wave-guides may conveniently be used to guide the waves to the irradiating structure. The geometry and dimensions of the wave-guide are chosen in order to reduce microwave losses. Preferably the wave-guide is designed to have as low a heat load to the low temperature space as possible, and can be made, for example, from silver plated thin-walled stainless steel. Corrugated wave-guides could also be used. At higher frequencies quasi-optical methods can be employed, and the microwave can be guided with lenses and mirrors. The microwave structure preferably has openings to allow an easy exchange of sample and efficient cooling of the sample. A suitable microwave oscillator generates the microwaves, e.g. an IMPATT diode oscillator, or an IMPATT amplified Gunn oscillator, or a BWO or the like.

Furthermore, the microwave oscillator may be an integrated part of the resonant structure for irradiating the sample. Thus the active device producing the microwaves may be physically placed in the magnet close to the sample whereby transmission losses would be reduced.

NMR detection is particular desirable for analytical applications. For other applications, NMR detection optionally provides a measure of the nuclear polarization. The NMR detection coil could be of any known design, e.g. solenoid or saddle shaped. Usually the coil (inductance) is tuned to the NMR frequency with a capacitor and matched to the characteristic impedance of the cabling. The NMR coil could be tuned and matched at a number of frequencies in order to detect the nuclei of interest of more than one nuclear species. The capacitors could be mounted close to the coil in the cold space. This would allow the highest Q-values to be obtained. In the event that it is impractical to have the capacitors close to the coil, then they may be put outside the cold space and connected to the low temperature space via a transmission line. The transmission line could be coaxial, twisted pair, stripline, or any other suitable cabling. The choice will be a compromise between heat load to the cold space and signal attenuation. Several coils could also be envisaged. They could be tuned for two NMR frequencies and would allow double resonance NMR (decoupling, cross polarization, etc) to be performed in both solid state and liquid phase. This would also allow simultaneous detection of more nuclei. The spectrometer would then have to have multiple receivers. Optionally, the NMR signal of the various nuclei could be acquired sequentially. In order to permit multiple samples to be analyzed in a short space of time, a sample-carousal (not shown) for moving samples may be provided. Additionally, the melting of the solid sample may be detected by optical means, as in order to perform reproducible NMR analysis. This may be checked by using optional optical photo-detection means inside or outside the NMR analytical chamber. Since some of the nuclei of interest may have very short $T_1$ values it can be important to secure analysis as soon as the melting process is finished. It is therefore preferable to have means arranged for coincident excitation/detection of all nuclei of interest. If the NMR detection circuit is cooled then a better signal-to-noise ratio is obtained. Furthermore, cooling of the signal amplifier is often advantageous. Consequently the signal amplifier may be positioned close to the NMR detection circuit and preferably in the cold space. Superconducting coils and SQUID detectors are other devices that are available to improve the signal-to-noise ratio.

Figure 3:
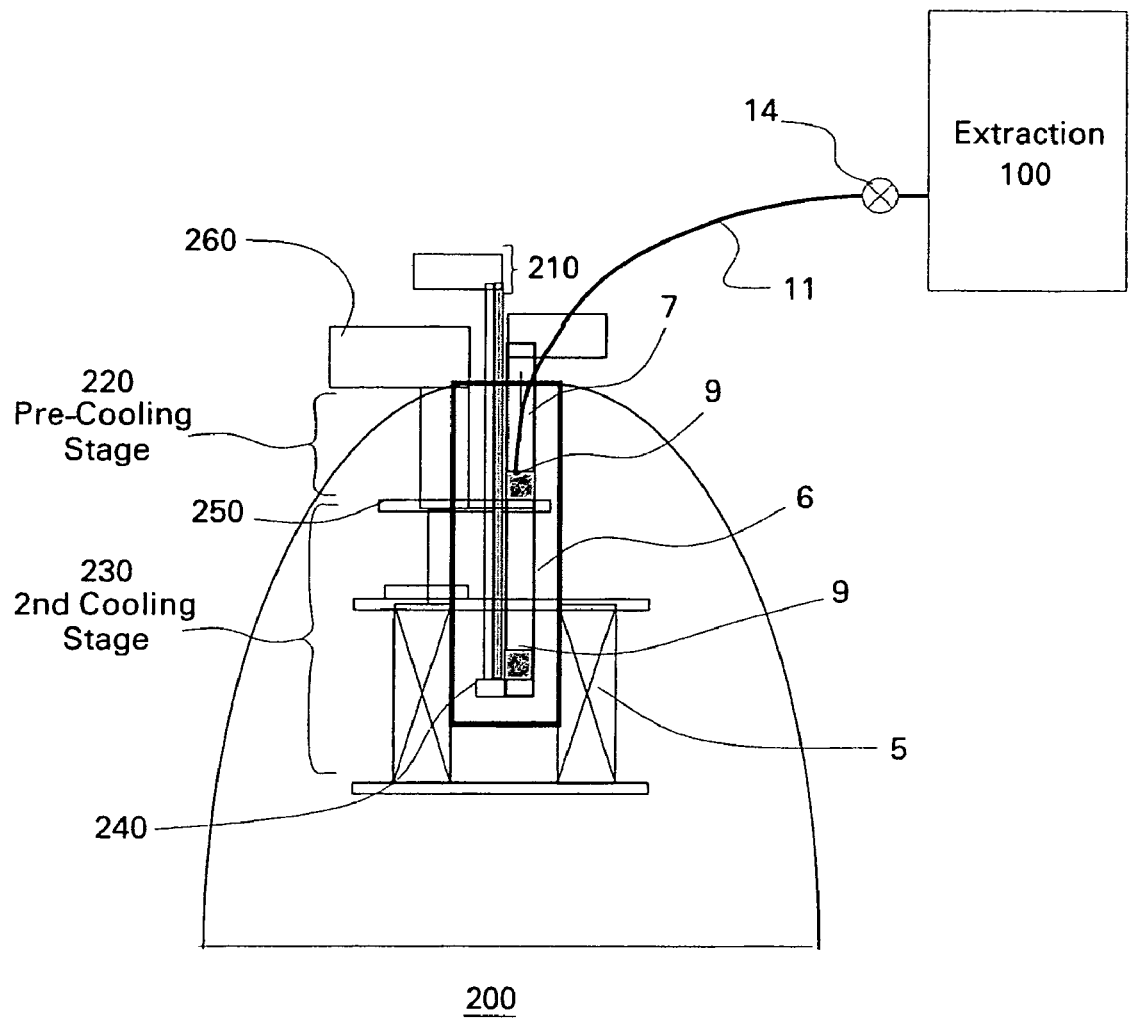
FIG. 3 is a lateral view of a schematic of a system for producing hyperpolarized samples for use in MRI according to embodiments of the present invention.

Referring to FIG. 3, an illustration of an embodiment of a cryostat structure in accordance with the present invention is shown. In an embodiment of the present invention, an apparatus for producing hyperpolarized samples for use in MRI comprises a cryostat structure 200 for use in producing the hyperpolarized samples from a solid material. The cryostat structure 200 comprises a bore 6 and bore 6 is capable of being evacuated in order to create a vacuum environment as described with reference to FIG. 2. Bore 6 is also for containing sample transport tube 7 which in turn contains sample cup(s) 9 for holding polarized material, preferably hyperpolarized material. A cooling device 210 is inserted into bore 6 and in close proximity to sample transport tube 7 for maintaining a selected temperature in the polarizing subsystem. In this embodiment, the methods and techniques for polarizing a solid material are identical to the methods described above with reference to FIG. 2, and the description corresponding to the reference numbers occurring in each figure are identical. However in this embodiment shown in FIG. 3, instead having a region inside bore 6 containing with a cooling liquid, such as liquid helium or another similar functioning cooling liquid, the cryostat structure 200 includes a cooling device 210 inserted into bore 6 or optionally in the cryostat vacuum close to the bore tube 6. Cooling device 210 may be a pulse-tube refrigeration (PTR) device, also known as a coldhead or coldfinger and hereinafter generally referred to as a "coldfinger" 210 inserted in bore 6. In a further embodiment, the coldfinger is a single-state PTR device. Coldfinger 210 is employed to maintain a selected temperature, for example below about 1.2 K, within the cryostat to act as a polarizing means in order to maintain the desired temperature and physical properties of the polarized material for its intended use in imaging using the MRI system. Coldfinger 210 is constructed to include a PTR unit and a tube structure having a generally vertical orientation for insertion into bore 6. In an embodiment of the present invention, coldfinger 210 is inserted vertically into central bore 6, and is operated in vertical orientation and in a vacuum environment. Coldfinger 210 is constructed of materials selected to generate cooling power below about 1.2 K, i.e. a temperature being able to maintain the sample at the necessary temperature for further use in MRI applications. Currently available coldfinger designs, employed for a variety of purposes, generally incorporate rare earth material, for example Nd. However, Nd is strongly hygroscopic, difficult to use and its cp value is not efficient for reaching temperatures below 2 K. With the arrival of GAP (gadolinium aluminum perovskites) and GOS (Gadolinium aluminium sulfate) and other ceramic type high-cp regenerator materials temperatures as low as 1.4 K have now been achieved with a 4 K dual-stage PTR using $He^3$. Similar high-cp materials are used successfully used in demagnetization refrigeration (ADD) systems. Desirably, the tube structure of coldfinger 210 is comprised of regenerator materials such as selected from the following: magnetic regenerator materials, ceramic oxide regenerator materials, and ceramic type high-cp materials. Other materials with high specific heat at sub-4K temperatures include: for example cp: in J/cm3K for GGG, GGG (Gd3Ga5O12) at 0.5 K, DAG (Dy3Al5O12) at 2.5 K, DAP (DyAlO3) at 3.5 K, GAP (GdAlO3) at 3.8 K, s well as TbGaO3, TbAlO3, TbFeO3, HoAlO3, ErAlO3, YbAlO3 and other rare-earth orthoaluminates with cp below 4 K.

In a further embodiment, the base temperature of coldfinger 210 is desirably less than 1.2 K and may comprise $Gd_{1.5}Al_{0.5}O_3$ as the regenerator material, for example, which is capable of delivering peaks in cp between 1.5 K and 3.5 K if fully exploited. Further performance improvement can be obtained by optimizing the well-known valve timing of the gas flow on the coldfinger using different orifice sizes or needle valves. Additionally, a high-efficiency heat exchanger (not shown) for the temperature range 1 to 2 K may be employed to further improve the cooling power of the PTR included in coldfinger 210. Lower temperatures below 1 K are obtained by adding a well-known superfluid Vortex cooling stage to the bottom of the coldfinger as described by De Waele in Journal of Applied Physics, Aug. 1, 2005 "The Superfluid Vortex Cooler". With the De Waele device, the enclosed device temperatures as low as 0.87 K have been obtained.

Referring further to FIG. 3, the cryostat structure 200 for producing hyperpolarized samples further comprises a first or pre-cooling stage 220 and a second cooling stage 230, in proximity to coldfinger 210. Additionally, cryostat structure 200 further comprises a cooling plate 240 acting as the base of the cooling structures and an intermediate cooling link 250 located between the first cooling stage 220 and the second cooling stage 230. Each component will now be described in greater detail below.

First or pre-cooling stage 220 in one embodiment is obtained from the cooling power of the magnet cooling system 260 of the NMR system and the cooling is transferred to coldfinger 210. Magnet cooling system 260 may be a 4K GM (Gifford-McMahon piston driven cooler) or similar device or of pulse tube cooler type in order to bring the coldfinger to a first level of cooled temperature. Magnet cooling system 260 further comprises an external 2 kW compressor or higher (not shown) for powering the cooling system. Coldfinger 210 is thus pre-cooled at one circumferential area. The required pre-cool temperature is not sensitive and can vary by +/−20 K without affecting the coldfinger performance, that is the temperature at the bottom tip of the coldfinger.

Second cooling stage 230 comprises the region between cooling plate 240 and intermediate cooling link 250 and provides the additional cooling power beyond the pre-cool or first cooling stage 220 to bring sample 9 to the desired temperature for its intended end use, for example about 1.2 K. If desired, an intermediate thermal link from the Magnet cooling system 260 which is at 4 K can be made to the Pulse Tube Cooler coldfinger 210 so as to provide an additional precooling stage and for precooling the sample if required.

Cooling plate 240 is located at the base of the components and may comprise the following highly conducting materials, e.g. copper or aluminium. Cooling link 250 provides a link to the magnet cooling system 260 and may be removable and flexible if desired. Since the PTR does not incorporate a moving piston the cooling plate located at the bottom of the PTR coldfinger tip is not subject to any vibrations.

Further improvement of the operating characteristics of the pulse tube cooler can help to achieve this temperature, such as the valve timing on the external drive system (not shown) of the PTR coldfinger. The optimum valve timing and frequency for this coldfinger is adjusted based on 4 variables that may be optimized (Regenerator in/out and PT1 in/out).

As mentioned above, Coldfinger 210 consists of two tubes located in the vacuum space in close proximity to central bore 6 or optionally in the bore tube 6 itself. The ceramic type high-cp material used in the regenerator tube of the coldfinger can be placed close to the magnet bore without performance degradation. The neighboring pulse tube is empty and pulsating with gaseous $He^3$ only.

Therefore, in this embodiment, employing coldfinger 210 enables a cryogen-free versus a "wet" polarizer system and has several advantages: It is operated in vertical orientation and is operated in vacuum only. A cooling power degradation of the coldfinger can thus be excluded such is the case when operating the coldfinger in a gaseous He environment. The hot top end of the cold finger where the extracted heat of only a few Watts from the coldfinger have to be dissipated typically requires a slotted heat exchanger or a commercially available aluminium finned structure as used to cool electronic instruments without a requirement for external forced flow air cooling This also enables the physical separation of the driving system from the PTR top end leading to a well-known "split"-drive system. This driving system, usually a rotary valve driven by a stepper motor or synchronous motor can be placed at any convenient location around the OVC (outer vacuum case) of the Polarizer system. There is also sufficient cooling on the intermediate section available at the coldfinger from the adjacent 4 K GM cooler or the 4 K PTR cooler to maximize the overall performance of the coldfinger without compromising the cooling power of the 4 K GM cooler or 4 K PTR cooler. The thermal link to the GM cooler can be made robust and reliable but still removable and flexible if desired.

Advantageously, there are a number of benefits to the embodiments of the present invention. For example, the cryostat structure is further simplified and will not require user handling of cryogenic liquids, which is particularly important if the system is located at a clinical site. Further, a sudden energy dump due to the magnet going normal will not affect the coldfinger and no Helium gas would be released or lost. Furthermore, there is no Helium-II creep due to the absence of the He-II container. Yet another advantage is that thermal switches and sorption pump as well as other components required for obtaining temperatures down to 1.2 K are not required, thus simplifying construction and minimizing space requirements towards an ultra compact NMR unit, as well as reducing further sources of noise. For instance, the coldfinger does not introduce any extra noise to the system and GM and PTR hybrid or PTR and PTR hybrid coexist along each other. No vibrations are induced from the coldfinger since the first stage GM contact can be made flexible, if a GM is to be chosen as the Magnet cooling system. There is also sufficient space for temporarily heat stationing the sample along the Pyruvate path. The heat stationing could take place at the link platform between the first cooling stage 220 of the 4 K GM cooler 260, at an intermediate 4 K stage and finally close to the coldfinger 210 tip on the cooling plate. He3 is desirably used in the compressor. The volume of He 3, required for the 2 kW compressor fill however is small.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An apparatus for producing hyperpolarized samples for use in one of a nuclear magnetic resonance (NMR) or a magnetic resonance imaging (MRI) system, the apparatus comprising:
    a cryogen-free cryostat structure for use in polarizing a sample of selected material, wherein the cryostat structure comprises:
    a central bore being adapted to be evacuated to create a vacuum region;
    a cooling device inserted in the central bore for maintaining a selected temperature of the sample;
    a first cooling stage and a second cooling stage for providing staged cooling of the sample; and
    wherein the first cooling stage comprises a cooler of the NMR system.

2. The apparatus of claim 1 where in the second cooling stage comprises:
    a cooling plate; and,
    a cooling link to a magnet cooling system of the MRI system, wherein the cooling plate and cooling link provide additional cooling to bring the selected material to a desired temperature.

3. A method for producing hyperpolarized samples for use in one of a magnetic resonance imaging (MRI) or nuclear magnetic resonance (NMR) system, the method comprising:
    providing a cryostat structure for use in polarizing a solid sample of selected material, wherein the cryostat structure comprises:
    a bore for containing the polarizing subsystem, the bore being configured to create a vacuum region; and,
    a cooling device inserted in the bore or next to the bore for maintaining a selected temperature in the sample.

4. The method of claim 3 wherein the cooling device is selected from a group comprising a dual-stage cold head device, a cold finger, devices constructed of regenerator materials and combinations thereof.

5. The method of claim 4 wherein the regenerator materials are constructed of materials selected to enable cooling to below 1.2K.

6. The method of claim 5 wherein the regenerator materials are selected from the group comprising magnetic regenerator materials, ceramic oxide regenerator materials, ceramic type high-cp materials, and combinations thereof.

7. The method of claim 3 wherein the cooling device is constructed of $Gd_{1.5}Al_{0.5}O_3$.

8. The method of claim 3 wherein the cryostat structure further comprises:
a magnetic field producing device surrounding the bore, the magnetic field producing device being configured to maintain a selected magnetic field in the polarizing system.

9. The method of claim 3 further comprising the steps of: evacuating and sealing the bore in order to create the vacuum region.

10. The method of claim 3 further comprising the step of: analyzing the hyperpolarized samples using a Nuclear Magnetic Resonance (NMR) analysis device.

11. The method of claim 3 further comprising the step of administering the hyperpolarized samples to a subject for in vivo MR imaging applications.

12. The method of claim 3 wherein the cryostat structure further comprises a first cooling stage and a second cooling stage for providing staged cooling of the sample.

13. The method of claim 12 wherein the first cooling stage comprises a cooler of the NMR system for cooling a thermal shield surrounding a superconducting magnet of the NMR system and for pre-cooling the cooling device.

14. The method of claim 13 where in the second cooling stage comprises a cooler of the NMR system for cooling the superconducting magnet.

* * * * *

UNITED STATES PATENT AND TRADEMARK OFFICE
CERTIFICATE OF CORRECTION

PATENT NO. : 7,631,507 B2 Page 1 of 1
APPLICATION NO. : 11/591846
DATED : December 15, 2009
INVENTOR(S) : Ernst Wolfgang Stautner It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 576 days.

Signed and Sealed this

Second Day of November, 2010

David J. Kappos
*Director of the United States Patent and Trademark Office*